United States Patent [19]
Ishii

[11] Patent Number: 5,158,121
[45] Date of Patent: Oct. 27, 1992

[54] METHOD OF BENDING LEAD OF ELECTRIC PART AND BENDER THEREFOR

[76] Inventor: Mitoshi Ishii, 1-3 Higashiohmichi 2-chome, Ohita-shi, Ohita 870, Japan

[21] Appl. No.: 698,227

[22] Filed: May 10, 1991

[51] Int. Cl.⁵ .............................................. B21F 1/00
[52] U.S. Cl. ...................................... 140/105; 72/381
[58] Field of Search ................. 140/105; 72/381, 382, 72/394, 396

[56] References Cited

U.S. PATENT DOCUMENTS 5,027,866  7/1991  Matsumoto ........................ 140/105

FOREIGN PATENT DOCUMENTS 0183723  7/1988  Japan ................................. 140/105
0309725  12/1989  Japan ................................. 140/105
1118455  10/1984  U.S.S.R. ............................. 140/105

*Primary Examiner*—David Jones
*Attorney, Agent, or Firm*—Armstrong, Nikaido, Marmelstein, Kubovcik & Murray

[57] ABSTRACT

A method of efficiently bending a lead of an electric part by use of a bender including an upper die and a lower die without denting or scratching the lead and hence causing no peeling of the plating therefrom. The method comprises the steps of: clamping the root portion of the leads between a moving stripper of the upper die and a fixed die member of the lower die; effecting a first motion in which the distal end portion of the lead that is clamped between a moving punch of the upper die and a moving die member of the lower die is pressed downwardly; and effecting a second motion simultaneously with the first motion, in which the moving punch and the moving die member, which clamp the distal end portion of the lead, are moved in a direction perpendicular to the direction of the first motion, thereby bending the lead along an approximately circular locus about the root portion of the lead by a resultant motion from the first and second motions of the moving punch and the moving die member.

5 Claims, 7 Drawing Sheets

METHOD OF BENDING LEAD OF ELECTRIC PART AND BENDER THEREFOR

BACKGROUND OF THE INVENTION

1. Field of the Invention

The present invention relates to bending of a lead of an electric part or the like. More particularly, the present invention relates to a method of Z-bending an end portion of a lead of an electric part such as an IC, LSI, etc. and also pertains to a bender which may be effectively employed to carry out the lead bending method.

2. Description of the Prior Art

The mainstream of LSI mounting methods has been shifting from the conventional method employing DIPs (Dual In-line Packages) to the so-called surface mounting method in which a leaded electric part or device package is electrically connected to a conductor provided on the surface of a printed wiring board without using throughholes for insertion of lead wires. This shift is made to cope with an increase in the number of gates or the like as a result of the improvements of LSI chips, i.e., the achievement of high integration density, the increase in the number of functions thereof, and the achievement of highspeed operation. Examples of known surface-mounted packages include resin-sealed SOJ (Small Outline "J") leaded packages and PLCCs (Plastic Leaded Chip Carriers). Leads that are used in these packages are bent in a J or L shape and therefore capable of being mounted directly on a printed wiring board (PWB).

In general, bending of lead wires of ICs is effected by press working. Since lead wires are extremely thin, they are fragile and it is therefore necessary to use extreme care in bending them. The conventional bending method, which has heretofore been carried out by the present inventor, will be explained below specifically with reference to FIGS. 8 and 9. An LSI package 60 is fed to a fixed die 80 by a robot hand or work feeder (not shown) and placed in a cavity 81 provided in the surface of the die 80. At this time, the root portion 64 of a lead 65 of the LSI package 60 is placed on a press projection 82 that is provided at the outer periphery of the cavity 81. Next, a press machine (not shown) is driven to lower a punch 70 so that the lead 65 is pressed from the root portion 64, thereby bending it into a substantially Z-like shape, as shown in FIG. 9. Thus, the lead 65 is pressed into a substantially Z-like shape by being clamped between the side and upper surfaces 83 and 84 of the press projection 82 of the die 80 and the side and lower surfaces 71 and 72 of the punch 70. In this way, so-called Z bending is performed.

Incidentally, the lead 65 is plated with solder or tin in order to improve the electric conductivity required when it is mounted on a printed wiring board (PWB) and to enhance the adhesion of solder used to connect the lead 65 to the PWB. In the conventional Z bending method, the surface of the lead 65 is in contact with a part of the surface of the punch 70 and portions b and d of the lead 65 are ironed by the punch 70, that is, subjected to burnishing. In consequence, the portions a and c are dented, while the portions b and d are scratched due to the frictional contact. In an extreme case, the plating on the lead 65 is peeled off. Incidentally, in recent SO- and QFP-type LSI packages, leads are extremely thin, narrow and short, that is, the lead pitch is in the range of from 0.3 mm to 0.8 mm, and the lead length is in the range of from 1 mm to 3 mm. When such an LSI package is mounted on a printed wiring board, if any of a large number of leads has the plating peeled therefrom due to a dent or scratch, the lead cannot be electrically connected to the printed wiring board, resulting in the whole product being defective.

The peeling of the plating from a lead gives rise to another problem. That is, the punch and die of the bender are fouled with the tin or other soft metal peeled from the lead. The tin or other soft metal thus attached to the bending members acts as a resistance that causes the lead 65 to be pulled in the directions of the arrows e and f (see FIG. 9). As a result, a thin gold wire 62 bonded between an IC chip 61 and a lead frame 63 inside the LSI package 60 is cut off. In addition, the mold 66 of the package 60 may be cracked in the form of a microcrack g.

Accordingly, it has been conventional practice to remove the bender from the press machine and remove the metal peeled off the lead 65 and attached to the punch 70 and the die 80 by a manual operation. Thus, the prior art suffers from the problems that the lifetime of the bender is short and the cost is high.

SUMMARY OF THE INVENTION

In view of the above-described problems of the prior art, it is an object of the present invention to provide a method which is capable of bending a lead of an electric part such as an LSI chip without producing an adverse effect on the body of the electric part, and also provide a bender which may be effectively employed to carry out the lead bending method.

It is another object of the present invention to provide a method which is capable of bending a lead of an electric part without causing the peeling of plating due to a dent or scratch, and also provide a bender which may be effectively employed to carry out the lead bending method.

It is still another object of the present invention to provide a method of bending a lead of an electric part, which enables an increase in the lifetime of a bender used therefor, and also provide a bender which may be effectively employed to carry out the lead bending method.

To these ends, the present invention provides a method of bending a lead (65) of an electric part by use of a bender (1) including an upper die (10) and a lower die (30), comprising the steps of: clamping the root portion of the lead (65) between a moving stripper (17) of the upper die (10) and a fixed die member (3) of the lower die (30); effecting a first motion in which the distal end portion of the lead (65) that is clamped between a moving punch (18) of the upper die (10) and a moving die member (31) of the lower die (30) is pressed downwardly; and effecting a second motion simultaneously with the first motion, in which the moving punch (18) and the moving die member (31), which clamp the distal end portion of the lead (65), are moved in a direction perpendicular to the direction of the first motion, thereby bending the lead (65) along an approximately circular locus about the root portion of the lead (65) by a resultant motion from the first and second motions of the moving punch (18) and the moving die member (31).

Preferably, when the distal end portion of the lead is released from the clamping by the moving die member (31) and the moving punch (18) after the bending, the release of the moving die member (31) is delayed by a predetermined time interval with respect to the release and return of the moving punch (18).

In addition, the present invention provides a bender (1) for bending a lead (65) of an electric part by use of an upper die (10) and a lower die (30), comprising: a punch holder (5) which is attached to a ram of a press machine to constitute a part of the upper die (10); a moving stripper (17) which is vertically movably supported by the punch holder (5) through a resilient support member (15) to secure the electric part, the stripper (17) being formed with first cam surfaces (23 and 24); a moving punch (18) which is provided on the punch holder (5) in such a manner that it is movable in a direction perpendicular to the direction of the vertical movement of the moving stripper (17), the moving punch (18) being formed with second cam surfaces (21 and 22) which come into contact with the first cam surfaces (23 and 24) to generate a locus for bending in response to the vertical movement; a die holder (2) which constitutes a part of the lower die (30); a fixed die member (3) which is provided on the die holder (2) to secure the electric part placed thereon, the die member (3) being formed with third cam surfaces (34 and 35); a moving die member (31) which is provided inside the fixed die member (3) to clamp the distal end portion of the lead (65) in cooperation with the moving punch (18), the moving die member (31) being formed with fourth cam surfaces (32 and 33) which come into contact with the third cam surfaces (34 and 35) to generate a locus for the bending; and means (44) for pressing the moving die member (31) to clamp the lead (65) in cooperation with the moving punch (18).

Preferably, the bender further comprises means (42) for temporarily suspending the operation of the pressing means (44).

Preferably, the temporarily suspending means is a piston (42) which is activated by fluid pressure.

The operation of the bender 1 for bending a lead of an electric part will be explained below. First, an LSI package 60 is fed onto the fixed die member 3 by a work feeder. Thereafter, the press machine is driven to lower the upper die 10. As a result, the lower surface of the moving stripper 17 comes into contact with the upper surface of the die member 3, so that the movement of the moving stripper 17 stops. At this time, the root portion 64 of the lead 65 is clamped between a press projection 3a of the die member 3 and a press projection 17a of the moving stripper 17. At the same time, the distal end portion of the lead 65 is clamped between the moving die member 31 and the moving punch 18.

As the punch holder 5 is further pressed to lower, the moving punch 18 is also pressed downwardly through the roller bearing 20. In consequence, the concave cams 21 of the moving punch 18 come into contact with the convex cams 23 of the moving stripper 17. As a result, the moving punch 18 and the moving die member 31 clamping the lead 65 move downwardly and sidewardly, that is, in a direction which is perpendicular to the downward direction, as shown in FIG. 2. These two motions are composed into an approximately circular motion about the root portion of the lead 65.

In this state, the ram is raised in order to release the lead 65. In consequence, the punch holder 5 moves upwardly to raise the moving punch 18. As the moving punch 18 moves upwardly, the piston 42 that is constantly biased upwardly by the coil spring 44 also moves upwardly. The upward movement of the piston 42 causes the moving die member 31 of the lower die 30 to move upwardly with the lead 65 clamped between the same and the moving punch 18. In the meantime, however, a bottom dead center sensor S2 detects the fact that the ram reaches the bottom dead center, and the output of the bottom dead center sensor S2 is input to a programmable controller 52. When receiving the signal, the programmable controller 51 activates a solenoid-operated valve 50 to supply compressed air from a pipe joint 48 to a cylinder bore 41 through an air supply passage 47.

Thus, the operation of the piston 42 prevents the moving die member 31 to be pushed up by the coil spring 44. If no compressed air were supplied, the moving die member 31 would push up the Z-bent lead 65 and deform it. As the upper die 10 is further raised, the lead 65 clamped between the projection 17a of the moving stripper 17 and the projection 3a of the die member 3 is released therefrom. Then, the LSI package 60 as a work is removed from the lower die 30 by a work extractor means (not shown). Thereafter, the solenoid-operated valve 50 is changed over to cut off the supply of the compressed air, thereby allowing the piston 42 to be returned to the previous position by means of the force from the coil spring 44.

BRIEF DESCRIPTION OF THE DRAWINGS

The above and other objects, features and advantages of the present invention will become more apparent from the following description of the preferred embodiments thereof, taken in conjunction with the accompanying drawings, in which like reference numerals denote like elements, and of which.

DESCRIPTION OF THE PREFERRED EMBODIMENTS

Embodiments of the present invention will be described below in detail with reference to the accompanying drawings.

First embodiment

Figure 1:
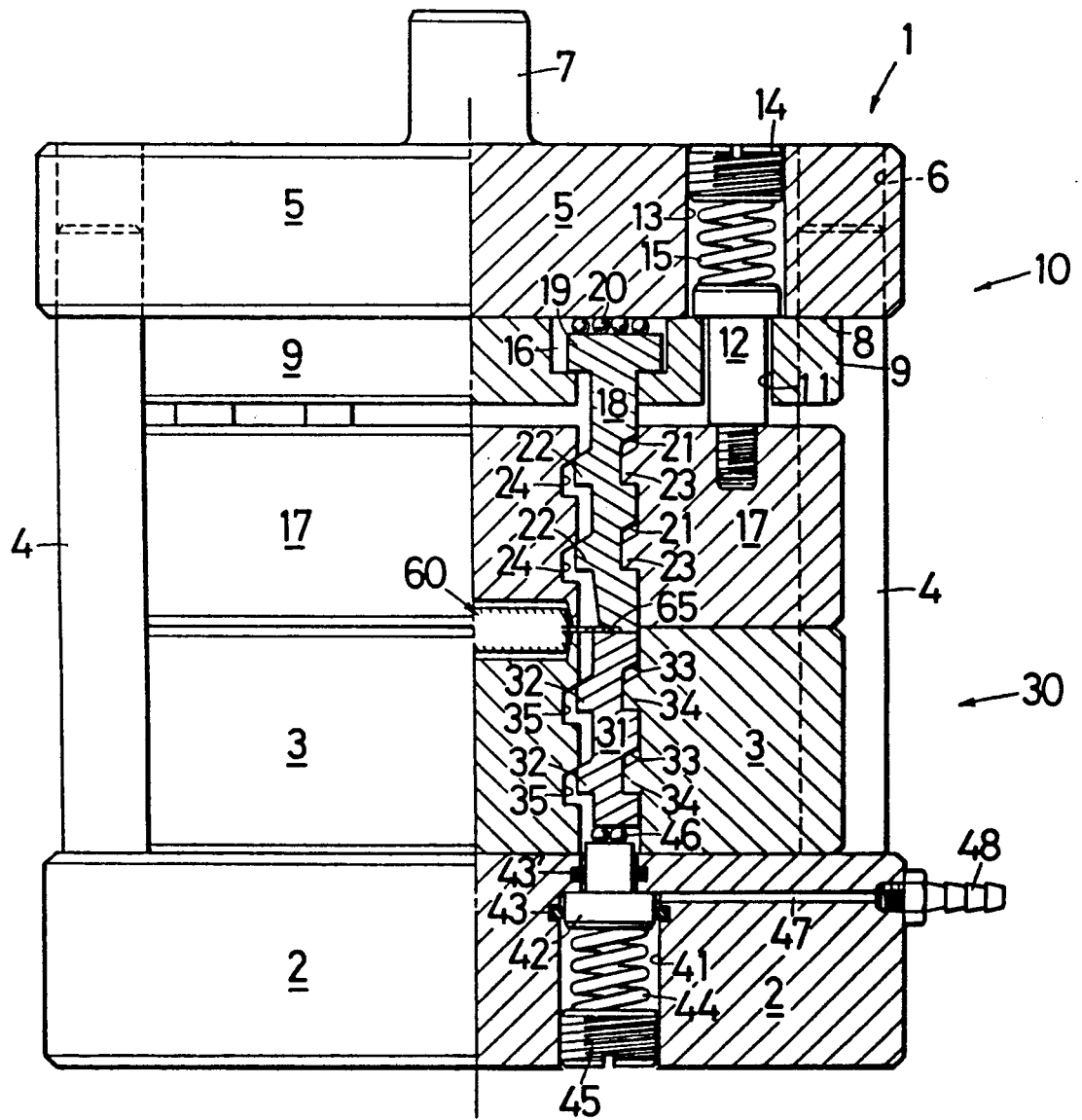
FIG. 1 is a partly sectioned view of a first embodiment of the bender according to the present invention.
Figure 2:
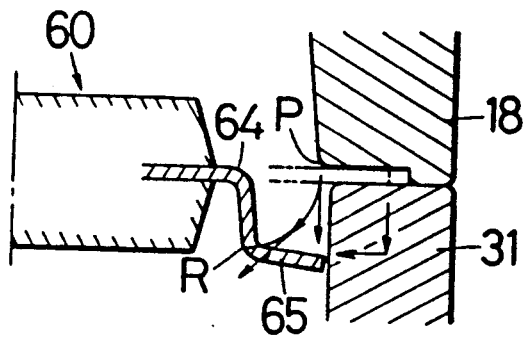
FIG. 2 shows the principle of the present invention.
Figure 8:
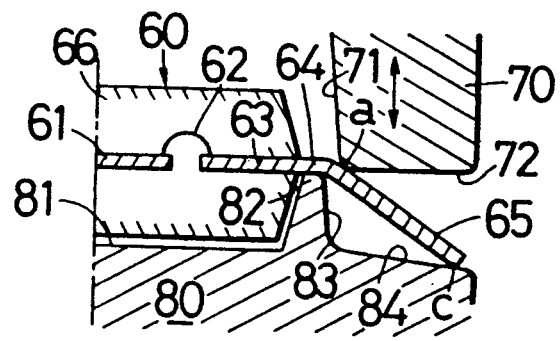
FIG. 8 is a sectional view of a lead which is being bent by a prior art.
Figure 9:
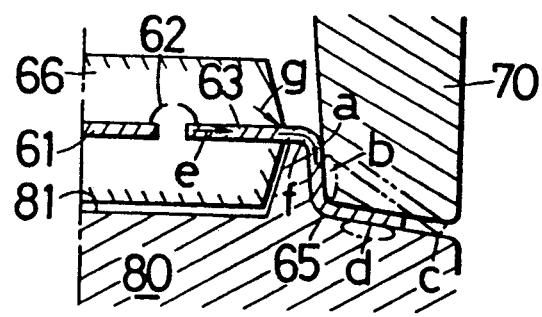
FIG. 9 is a sectional view of a lead which has been bent by the prior art.

FIG. 1 is a partly sectioned view of a bender 1 for bending a lead of an LSI package according to a first embodiment of the present invention. FIG. 2 shows the locus of movement of a lead when bent by the bender 1. The distal end portion of a lead 65 is clamped between a moving punch 18 and a moving die member 31 and moved obliquely downward, so that the point P moves to the point R along an approximately circular locus. Thus, the lead 65 is bent in the shape of a Z.

The bender 1 basically comprises an upper die 10 and a lower die 30. A die holder 2 is disposed in the lowermost part of the bender 1. A fixed die member 3 is brought into contact at its lower end with the upper surface of the die holder 2 and secured thereto in one unit by means of bolts (not shown). The die holder 2 is provided with a plurality of guide posts 4. The upper ends of the guide posts 4 are movably inserted into respective guide post holes 6 provided in a punch holder 5 to guide it vertically.

Upper die 10

Figure 4:
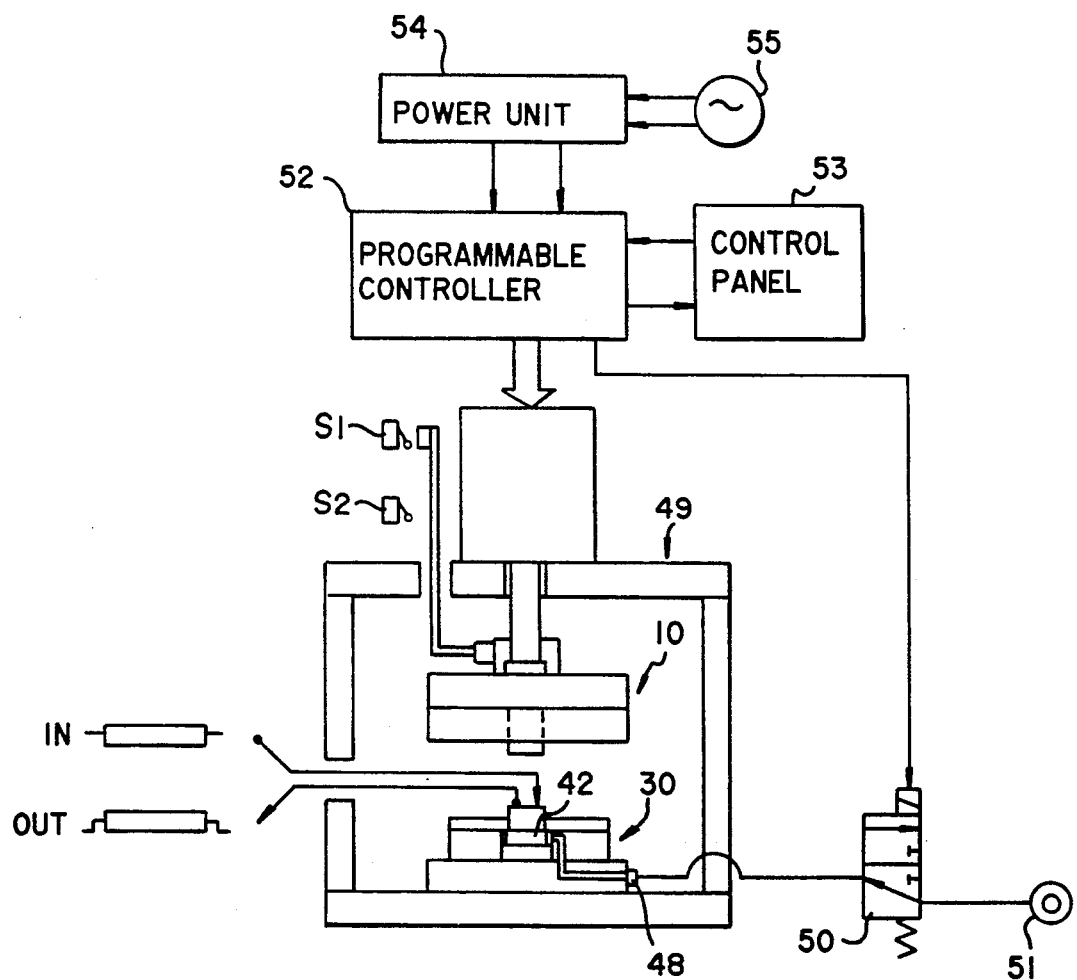
FIG. 4 is a schematic diagram of a bender system according to the present invention.

A shank 7 that is provided on the upper surface of the punch holder 5 is attached to a ram of a press machine 49 (see FIG. 4). A punch plate 9 is secured to the lower surface 8 of the punch holder 5. A bolt 12 is loosely inserted into a circuit bore 11 provided in the punch plate 9. A spring insertion bore 13 is formed in the punch holder 5 at a position directly above the bolt 12.

A screw 14 is screwed into the upper end of the spring insertion bore 13. A coil spring 15 is interposed between the screw 14 and the bolt 12. The screw 14 is used to adjust the intensity of force from the coil spring 15. A moving stripper 17 is secured to the lower end of the bolt 12 by thread engagement.

An upper end engagement portion 19 of the moving punch 18 is inserted into a space 16 provided in the punch plate 9. A roller bearing 20 is disposed between the upper end engagement portion 19 and the punch holder 5. Accordingly, the moving punch 18 is movable along the lower surface 8 of the punch holder 5, that is, in a direction perpendicular to the vertical axis of the punch holder 5.

The moving punch 18 has concave cams 21 formed in one side surface thereof. The other side surface of the moving punch 18 is formed with convex cams 22. On the other hand, the moving stripper 17 is provided with convex cams 23 respectively corresponding to the concave cams 21. In addition, the moving stripper 17 has concave cams 24 formed at respective positions which face the convex cams 22.

Lower die 30

Inside the die member 3 of the lower die 30 is disposed a moving die member 31 which moves in association with the moving stripper 18. The moving die member 31 has convex cams 32 which are formed on one surface thereof. The other surface of the moving die member 31 is formed with concave cams 33. On the other hand, the die member 3 has convex cams 34 formed at respective positions which face the concave cams 33. In addition, the die member 3 has concave cams 35 disposed at respective positions which face the convex cams 32. These cams 32, 33, 34 and 35, which constitute a cam mechanism, are guided in contact with each other during an operation to generate a predetermined working curve.

The die holder 2 is formed with a cylinder bore 41. A piston 42 is vertically movably fitted in the cylinder bore 41, the piston 42 having two different diameters, i.e., a relatively small diameter and a relatively large diameter. O-rings 43 and 43' are disposed on the outer periphery of the cylinder bore 41 to prevent leakage of the air through the area between the piston 42 and the cylinder bore 41.

The lower side of the piston 42 is contacted by the upper end of a coil spring 44. The lower end of the coil spring 44 is in contact with one end of a screw 45. The screw 45 is screwed into the lower end of the cylinder bore 41. Accordingly, the intensity of force from the coil spring 44 can be adjusted by turning the screw 45. A roller bearing 46 is interposed between the lower end of the moving die member 31 and the upper end of the piston 42 to facilitate the horizontal movement of the moving die member 31.

The die holder 2 has an air supply passage 47 which is bored therein. One end of the air supply passage 47 is connected to the piston 42, and the other end to a pipe joint 48 that leads to the outside of the die holder 2. The pipe joint 48 is connected through a solenoid-operated valve 50 to an air pressure source 51. The solenoid-operated valve 50 is controlled by a programmable controller 52.

The programmable controller 52, whose program can be changed as desired, controls the press machine 49 by sequence control. The programmable controller 52 is supplied with a position signal from a top dead center sensor S1 and a bottom dead center sensor S2, which are provided on a ram of the press machine 49. A control panel 53 is a means for input and output, which is used to control the operation of the press machine 49, input data to the programmable controller 52 and change the sequence program. The programmable controller 52 is supplied with electric power from an alternating-current power supply 55 through a power unit 54. The programmable controller 52 operates the press machine 49 by use of this electric power. By opening and closing the solenoid-operated valve 50, the air is supplied and cut off. By temporarily sending compressed air through the pipe joint 48, the piston 42 is lowered against the coil spring 44 to thereby suspend the upward movement of the moving die member 31. More specifically, when an operation of Z-bending the lead 65 has been completed, as described hereinbelow, the upward movement of the moving die member 31 is suspended by the piston 42 to prevent deformation of the Z-bent lead 65.

Operation

Figure 6:
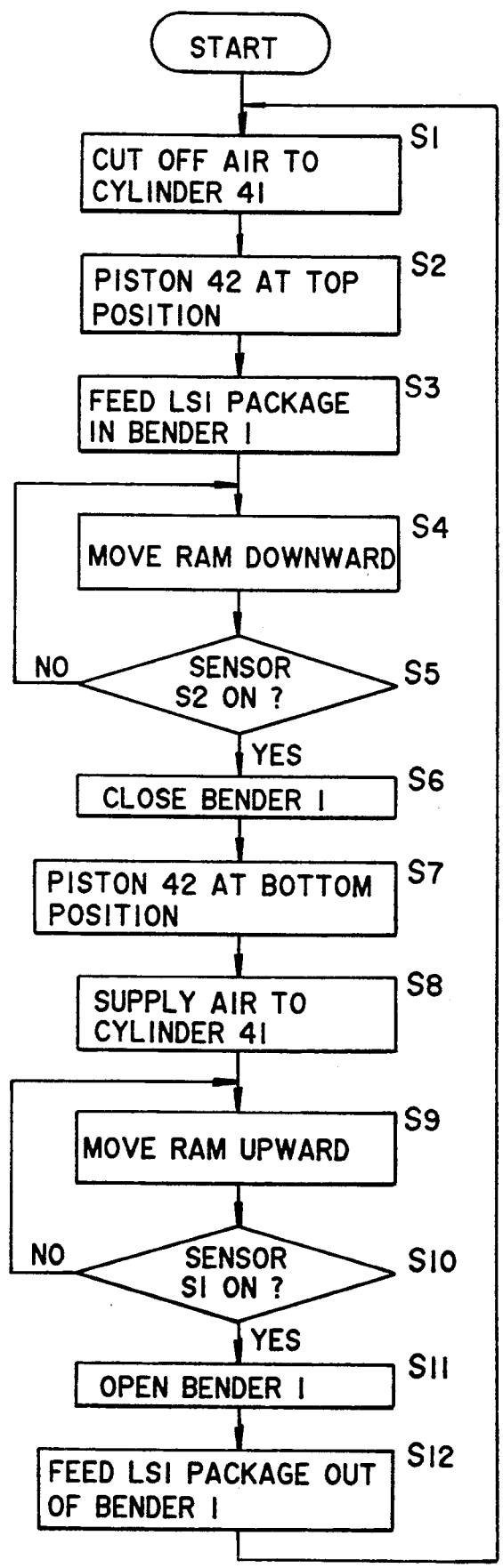
FIG. 6 is a schematic flow chart of the operation of the system shown in FIG. 4.

The operation of the bender 1 for bending a lead of an electric part will be explained below. First, the solenoid-operated valve 50 is changed over to cut off the supply of the compressed air (Step $S_1$ in FIG. 6; hereinafter, the term "Step" will be omitted), thereby allowing the piston 42 to be pushed up by the coil spring 44 ($S_2$), and thus causing the moving die member 31 to be pushed up by the piston 42 from below it. Then, an LSI package 60 is fed onto the die member 3 by a work feeder ($S_3$). Thereafter, the press 20 machine 49 is driven to lower the upper die 10 ($S_4$). The downward movement of the ram and the upper die 10 is detected by the bottom dead center sensor S2 ($S_5$). As a result, the lower surface of the moving stripper 17 comes into contact with the upper surface of the die member 3, so that the movement of the moving stripper 17 stops. At this time, the root portion 64 of the lead 65 is clamped between a press projection 3a of the die member 3 and a press projection 17a of the moving stripper 17 ($S_6$). At the same time, the distal end portion of the lead 65 is clamped between the moving die member 31 and the moving punch 18.

Figure 3:
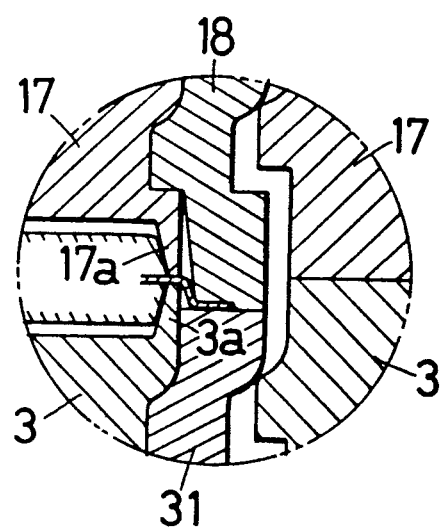
FIG. 3 is a sectional view showing a lead bent by the bender of the present invention.

As the punch holder 5 is further pressed to lower, the moving punch 18 is also pressed downwardly through the roller bearing 20. In consequence, the concave cams 21 of the moving punch 18 come into contact with the convex cams 23 of the moving stripper 17. As a result, the moving punch 18 and the moving die member 31 clamping the lead 65 move downwardly, that is, in a first direction, and sidewardly, that is, in a second direction which is perpendicular to the first direction, as shown in FIG. 2. These two motions are composed into an approximately circular motion about the root portion of the lead 65. The composite locus of these movements can be changed delicately by changing the profile of each cam. Finally, the end portion of the lead 65 is bent obliquely downward in the shape of a Z. FIG. 3 shows the respective positions of the moving punch 18 and the moving die member 31 when the Z bending of the lead 65 has been completed ($S_7$).

In this state, the ram is raised in order to release the lead 65. In consequence, the punch holder 5 moves upwardly to raise the moving punch 18 ($S_9$). As the moving punch 18 moves upwardly, the piston 42 that is constantly biased upwardly by the coil spring 44 also moves upwardly. The upward movement of the piston 42 causes the moving die member 31 of the lower die 30 to move upwardly with the lead 65 clamped between the same and the moving punch 18. In the meantime, however, the bottom dead center sensor S2 detects the fact that the ram reaches the bottom dead center, and the output of the sensor S2 is input to the programmable controller 52. When receiving the signal, the programmable controller 52 effects time adjustment with a timer and then activates the solenoid-operated valve 50 to supply compressed air from the joint 48 to the cylinder bore 41 through the air supply passage 47 ($S_8$). The time set on the timer is adjusted to an optimal length of time ($t_1$ or $t_2$) with such factors as the press cycle time and the work unloading speed taken into consideration.

Figure 5:
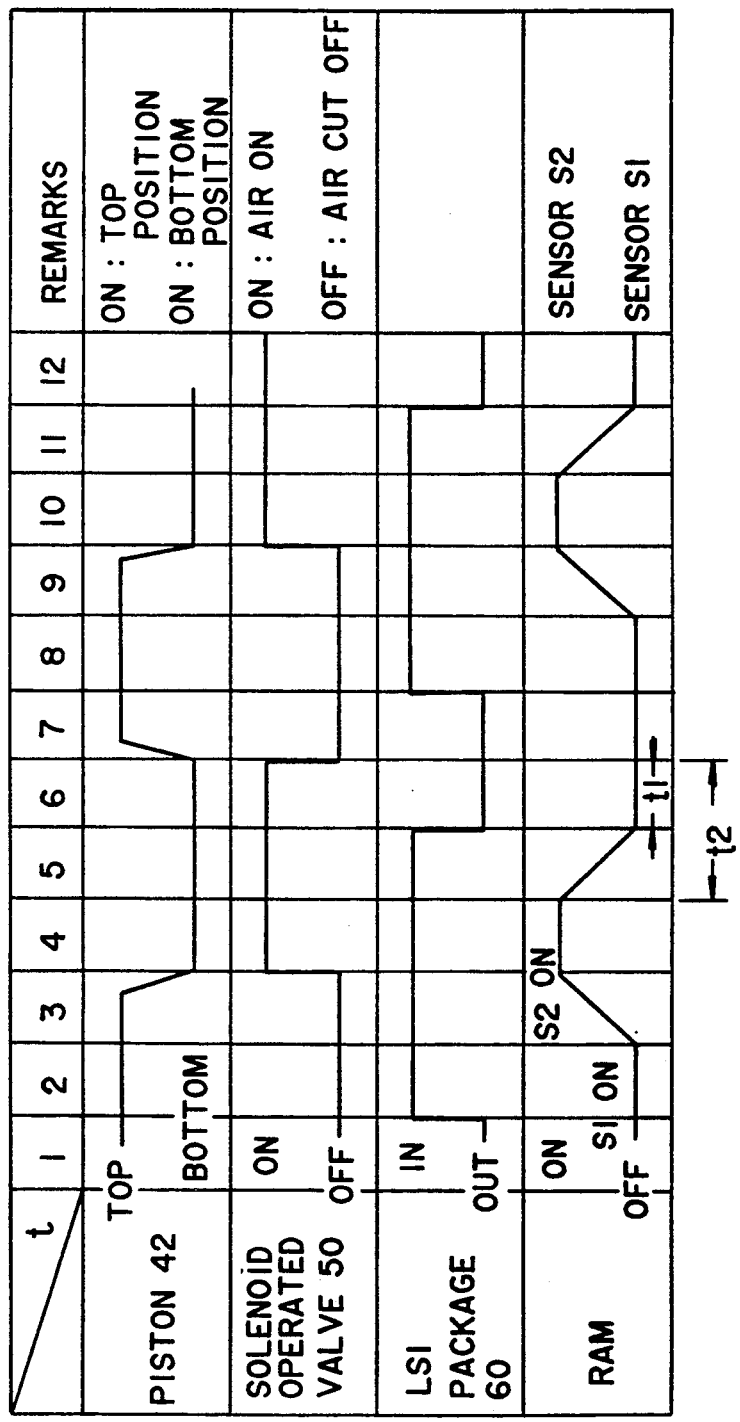
FIG. 5 is a time chart of the system shown in FIG. 4.

Thus, the operation of the piston 42 prevents the moving die member 31 to be pushed up by the coil spring 44. If no compressed air were supplied, the moving die member 31 would push up the Z-bent lead 65 and deform it. As the upper die 10 is further raised ($S_9$), the lead 65 clamped between the projection 17a of the moving stripper 17 and the projection 3a of the die member 3 is released therefrom ($S_{11}$). The movement of the upper die 10, that is, the movement of the ram, is detected by the top dead center sensor S1 ($S_{10}$). Then, the LSI package 60 as a work is removed from the lower die 30 by a work extractor means (not shown) ($S_{12}$). After the time t (see FIG. 5), the solenoid-operated valve 50 is changed over to cut off the supply of the compressed air, thereby allowing the piston 42 to be returned to the previous position by means of the force from the coil spring 44.

Thus, the moving punch 18, the moving stripper 17, the moving die member 31 and the punch holder 5 return to their previous positions to stand by, thus completing all the steps of the lead bending process. As will be understood from the detailed description of the operation of the bender 1, with the root portion 64 of the lead 65 secured, the distal end portion of the lead 65 is moved along a substantially circular locus to realize Z bending and there is therefore no possibility of the lead 65 being dented or scratched. Since no force acts to pull the lead 65 during the Z bending operation, no extra stress is generated inside the LSI package 60. Accordingly, the bending process causes no destruction of an element inside the LSI package 60. In addition, no metal that constitutes the lead 65 will adhere to the bender 1.

Second embodiment

Figure 7:
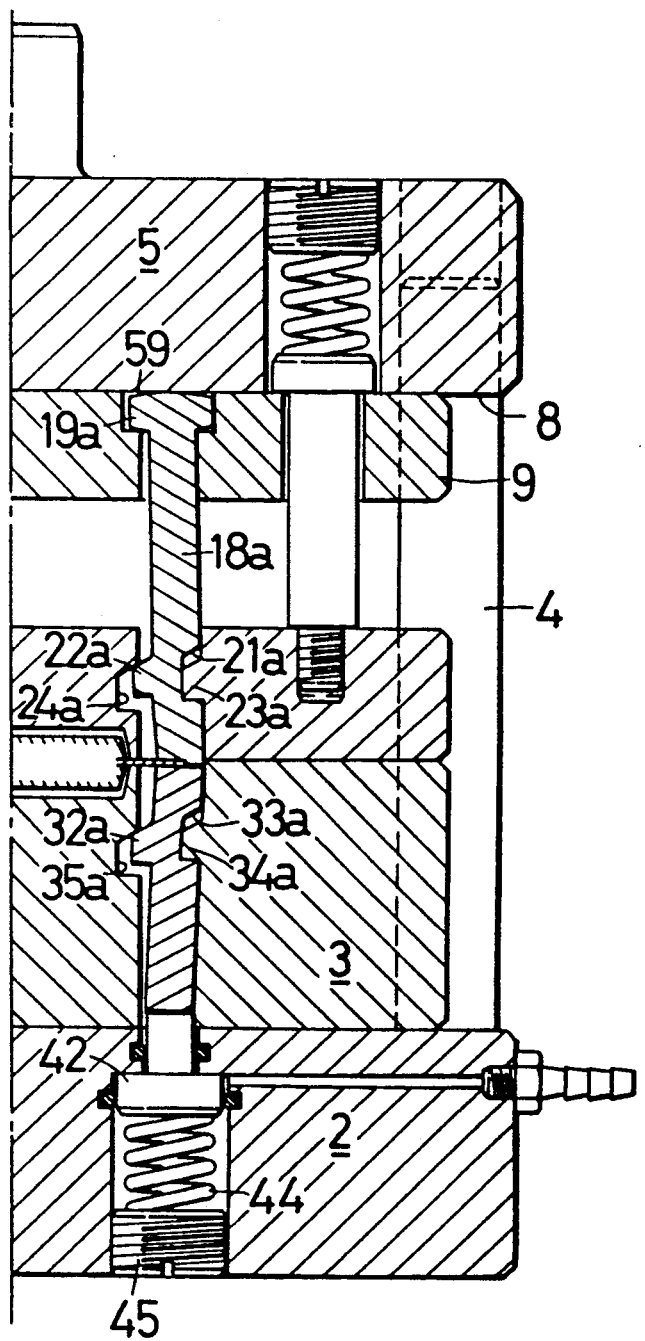
FIG. 7 is a fragmentary sectional view of a second embodiment of the bender according to the present invention.

FIG. 7 shows a second embodiment of the present invention. In the first embodiment, the moving punch 18 moves along the lower surface 8 of the punch holder 5. In the second embodiment, the moving punch 18a is capable of rolling. The moving punch 18a has a cylindrical surface 59 which is formed on its upper end 19a so as to roll on the lower surface 8 of the punch holder 5.

Accordingly, the second embodiment, which uses no extra parts such as a roller bearing, is simpler in the structure and more economical than the first embodiment. The functions of the other parts are, however, substantially the same as those in the first embodiment.

Other embodiments

The piston 42 in the first and second embodiments is driven by air. However, the piston 42 may be driven by use of a solenoid that is activated by an electric current.

Further, a known spring-loaded hydraulic shock absorber may be employed in place of the combination of the piston 42 and the coil spring 44. The essential thing is to delay the return of the moving die member 31 (31a) to the previous position after the Z bending of a lead.

Thus, the present invention provides the following advantageous effects:

a. The lead that is bent by the method of the present invention is not dented or scratched, so that the plating is not peeled off.
b. There is no possibility of the moving punch, the moving die member, etc. being fouled with tin or other soft metal which would otherwise be peeled from the lead being bent.
c. During the Z bending of a lead, no force acts as pulling force which produces adverse effects such as the cutting off of a thin gold wire connecting together the IC chip and the lead frame and the generation of a microcrack in the mold.
d. The lifetime of the bender increases, which is advantageous from the viewpoint of depreciation.
e. Since the bender requires a reduced number of setup operations, the mechanical efficiency is high and the productivity is superior.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A method of bending a lead (65) of an electric part by use of a bender (1) including an upper die (10) and a lower die (30), comprising the steps of:

clamping a root portion of said lead (65) between a moving stripper (17) of said upper die (10) and a fixed die member (3) of said lower die (30);

effecting a first motion in which a distal end portion of said lead (65) that is clamped between a moving punch (18) of said upper die (10) and a moving die member (31) of said lower die (30) is pressed downwardly; and effecting a second motion simultaneously with said first motion, in which said moving punch (18) and said moving die member (31), which clamp the distal end portion of said lead (65), are moved in a direction perpendicular to the direction of said first motion, thereby bending said lead (65) along an approximately circular locus about said root portion of said lead (65) by a resultant motion from said first and second motions of said moving punch (18) and said moving die member (31).

2. A method of bending a lead of an electric part according to claim 1, wherein, when said distal end portion of said lead is released from said clamping by said moving die member (31) and said moving punch (18) after said bending, the release of said moving die member (31) is delayed by a predetermined time interval ($t_1$, $t_2$) with respect to the release and return of said moving punch (18).

3. A bender (1) for bending a lead (65) of an electric part by use of an upper die (10) and a lower die (30), comprising:

a punch holder (5) which is attached to a ram of a press machine to constitute a part of said upper die (10);

a moving stripper (17) which is vertically movably supported by said punch holder (5) through a resilient support member (15) to secure said electric part, said stripper (17) being formed with first cam surfaces (23 and 24);

a moving punch (18) which is provided on said punch holder (5) in such a manner that it is movable in a direction having components both parallel and perpendicular to the direction of the vertical movement of said moving stripper (17), said moving punch (18) being formed with second cam surfaces (21 and 22) which come into contact with said first cam surfaces (23 and 24) to generate a locus for bending in response to said vertical movement;

a die holder (2) which constitutes a part of said lower die (30);

a fixed die member (3) which is provided on said die holder (2) to secure said electric part placed thereon, said die member (3) being formed with third cam surfaces (34 and 35);

a moving die member (31) which is provided inside said fixed die member (3) to clamp the distal end portion of said lead (65) in cooperation with said moving punch (18), said moving die member (31) being formed with fourth cam surfaces (32 and 33) which come into contact with said third cam surfaces (34 and 35) to generate a locus for said bending; and means (44) for pressing said moving die member (31) to clamp said lead (65) in cooperation with said moving punch (18).

4. A bender for bending a lead of an electric part according to claim 3, further comprising means (42) for temporarily suspending the operation of said pressing means (44).

5. A bender for bending a lead of an electric part according to claim 4, wherein said temporarily suspending means is a piston (42) which is activated by fluid pressure.

* * * * *